United States Patent
Mathur

(10) Patent No.: US 9,240,787 B2
(45) Date of Patent: Jan. 19, 2016

(54) WIDE SUPPLY RANGE HIGH SPEED LOW-TO-HIGH LEVEL SHIFTER

(71) Applicant: SanDisk Technologies Inc., Plano, TX (US)

(72) Inventor: Shiv Harit Mathur, Bangalore (IN)

(73) Assignee: SanDisk Technologies Inc., Plano, TX (US)

(*) Notice: Subject to any disclaimer, the term of this patent is extended or adjusted under 35 U.S.C. 154(b) by 0 days.

(21) Appl. No.: 14/245,364

(22) Filed: Apr. 4, 2014

(65) Prior Publication Data

US 2015/0180474 A1    Jun. 25, 2015

(30) Foreign Application Priority Data

Dec. 19, 2013  (IN) .......................... 5957/CHE/2013

(51) Int. Cl.
*H03K 19/0175*  (2006.01)
*H03K 19/0185*  (2006.01)

(52) U.S. Cl.
CPC ........ *H03K 19/0175* (2013.01); *H03K 19/0185* (2013.01)

(58) Field of Classification Search
CPC ...................... H03K 19/0175; H03K 19/0185
See application file for complete search history.

(56) References Cited

U.S. PATENT DOCUMENTS

| | | |
|---|---|---|
| 7,986,165 B1 | 7/2011 | Lin et al. |
| 2006/0033530 A1 | 2/2006 | Seo |
| 2006/0061386 A1* | 3/2006 | Kanzaki .......................... 326/81 |
| 2008/0007315 A1* | 1/2008 | Huang et al. .................. 327/333 |
| 2008/0204078 A1 | 8/2008 | O |
| 2010/0061164 A1 | 3/2010 | Tandon et al. |
| 2012/0206180 A1 | 8/2012 | Lin |

* cited by examiner

*Primary Examiner* — Jany Richardson
(74) *Attorney, Agent, or Firm* — Brinks Gilson & Lione

(57) ABSTRACT

A level shifter may include a first current source configured to source current to a node that pulls up an output voltage of the level shifter to a logic high level and a second current source configured to sink away current from the node to pull down the output voltage to a logic low level. When the output voltage at the node reaches the logic high voltage, the first current source may be deactivated while a latch connected to the node maintains the output voltage at the logic high level. Similarly, when the output voltage reaches the logic low voltage, the second current source may be deactivated while the latch maintains the output voltage at the logic low level.

20 Claims, 4 Drawing Sheets

US 9,240,787 B2

WIDE SUPPLY RANGE HIGH SPEED LOW-TO-HIGH LEVEL SHIFTER

CROSS-REFERENCE TO RELATED APPLICATIONS

This application claims priority to Indian Patent Application No. 5957/CHE/2013, filed Dec. 19, 2013. The contents of Indian Patent Application No. 5957/CHE/2013 are incorporated by reference in their entirety.

BACKGROUND

Level shifters are electronic circuits that convert input signals having logic voltage levels in a first voltage domain to output signals having logic voltage levels in a second voltage domain. Some level shifters may be low-to-high level shifters, where one or more logic voltage levels in the first voltage domain is lower than one or more of corresponding voltage levels in the second voltage domain. Other level shifters may be high-to-low level shifters, where one or more logic voltage levels in the first domain is higher than one or more corresponding voltage levels in the second voltage domain. Level shifters may be configured in chips or dies having different operational domains and/or interfaces. Additionally, level shifters may be building blocks for integrated circuit (IC) design, including those using complimentary metal-oxide-semiconductor (CMOS) technology.

SUMMARY

In a first aspect, a level shifter may be configured to convert an input voltage having a first logic high level and a first logic low level to an output voltage having a second logic high level and a second logic low level. The level shifter may include: a conversion node at which the output voltage having the second logic high level and the second logic low level is generated; a first current source that, when activated, is configured to source current to the conversion node to generate the output voltage at the second logic high level; and a second current source that, when activated, is configured to sink current away from the conversion node to generate the output voltage at the second logic low level. The level shifter may also include a latch that is configured to maintain the output voltage at the conversion node when both the first current source and the second current source are deactivated.

In a second aspect, a method of converting an input voltage having a first logic high level and a first logic low level to an output voltage having a second logic high level and a second logic low level may include: activating current source circuitry to generate, at a conversion node, the output voltage at one of the second logic high level or the second logic low level in response to a corresponding transition of the input voltage; deactivating the current source circuitry when the output voltage reaches a triggering voltage level associated with the one of the second logic high level or the second logic low level; and maintaining, with a latch connected to the conversion node, the output voltage at the one of the second logic high level or the second logic low level.

In a third aspect, a level shifter may be configured to convert an input voltage having a first logic high level and a first logic low level to an output voltage having a second logic high level and a second logic low level. The level shifter may include: current source circuitry configured to: activate to pull up and down the output voltage at a conversion node to the second logic high and second logic low levels in response to corresponding transitions of the input voltage between the first logic high and first logic low levels; and deactivate when the output voltage reaches triggering voltage levels associated with the second logic high and second logic low levels. The level shifter may also include a latch configured to maintain the output voltage at the conversion node at the second logic high and second logic low levels when the current source circuitry is deactivated.

In sum, a level shifter may include a latch configured to maintain an output voltage when both pull up and pull down circuitry are deactivated, which may help to minimize current consumption in the level shifter. Additionally, the level shifter may not have a contention path during logic transition changes, which may result in increased performance. Further, the level shifter may be implemented and/or configured to operate over wide operational ranges between the first and second voltage domains, which may be facilitated through the use of current mirroring techniques. An example operational range may be from 0.6 V to 3.6 V as an example.

These and other embodiments, features, aspects and advantages of the present description will become better understood from the description herein, appended claims, and accompanying drawings.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Various modifications to and equivalents of the embodiments described and shown are possible and various generic principles defined herein may be applied to these and other embodiments. Thus, the claimed invention is to be accorded the widest scope consistent with the principles, features, and teachings disclosed herein.

Figure 1:
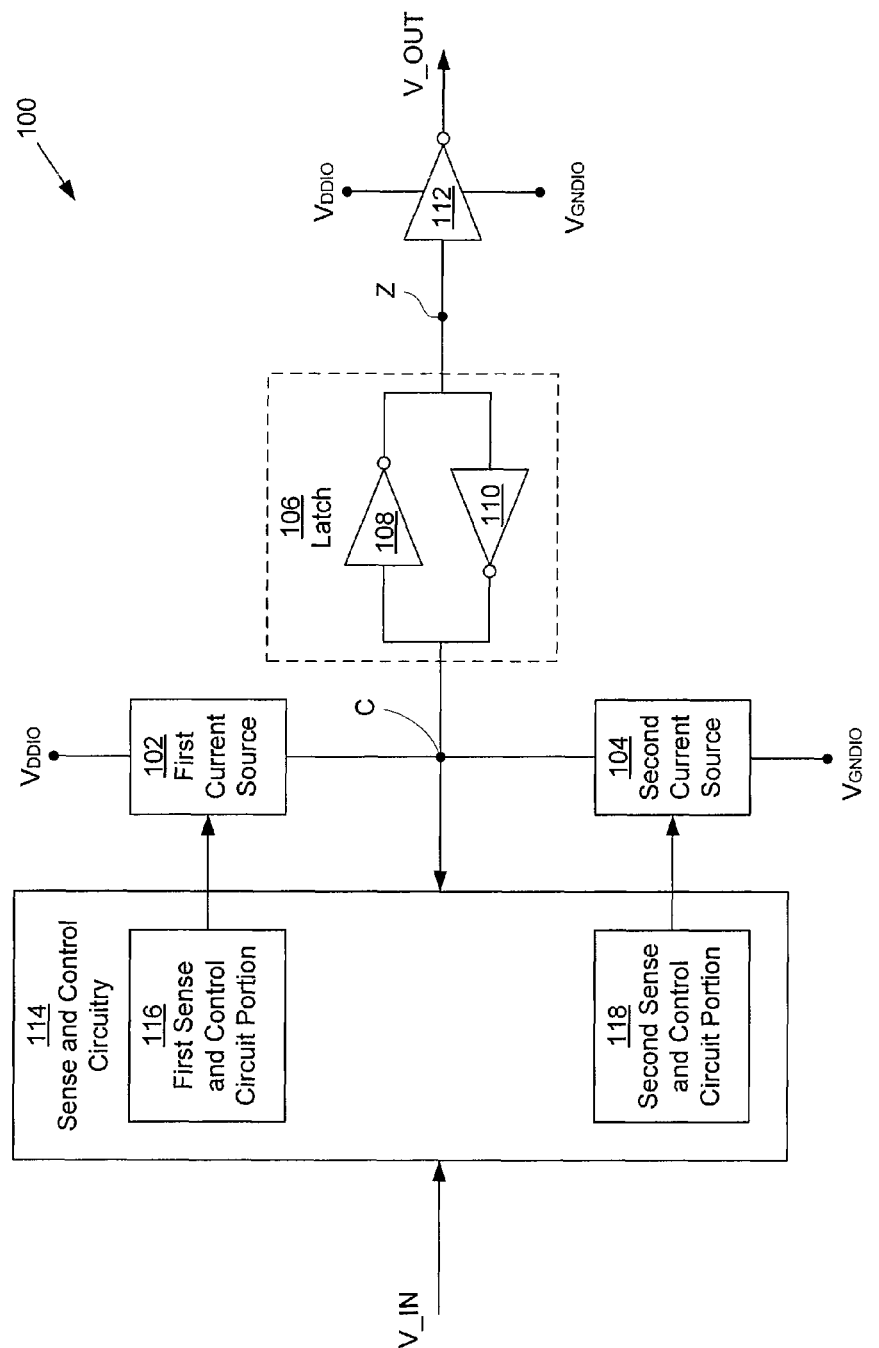
FIG. 1 is block diagram of an example level shifter.

FIG. 1 shows a block diagram of an example level shifter 100 that is configured to convert input signals having logic voltages in a first voltage domain to output signals having logic voltages in a second voltage domain. The logic voltages may be at voltage levels corresponding to logic "high" and logic "low" levels. The level shifter 100 may be and/or configured to operate as a low-to-high level shifter in that at least one of the voltage levels in the first voltage domain may be lower than at least one of the corresponding voltage levels in the second voltage domain. For example a voltage level corresponding to a logic "high" (i.e., a logic high voltage level) may be lower in the first voltage domain than in the second voltage domain, while the voltage level corresponding to a logic "low" (i.e., a logic low voltage level) in the first voltage domain may be the same as the logic low voltage level in the second voltage domain. For example, the logic low voltage levels may both be ground reference voltages. However, in some example configurations, the ground reference voltages in the different domains may be different despite having the same direct current (DC) voltage, such as by being ground references for different or separate circuits or chips. In alternative example configurations, both the logic high and the logic low voltage levels may be lower in the first voltage domain than in the second voltage domain. In still other example configurations, the logic high voltage levels may be the same, while the logic low voltage level in the first voltage domain is lower than the logic low voltage level in the second voltage domain. Various configurations of logic voltage levels between the first and second voltage domains for the level shifter 100 are possible.

The level shifter 100 may include a conversion node C at which the logic high and logic low voltage levels in the second voltage domain may be generated. The level shifter 100 may further include a first current source 102, a second current source 104, and a latch 106 connected to the conversion node C. The first current source 102, in addition to being connected to the conversion node C, may be connected or coupled to a power supply voltage $V_{DDIO}$, which may be and/or correspond to the logic high voltage of the second voltage domain. The first current source 102, when activated, may be configured to supply or source electrical current to the conversion node C to generate the logic high voltage. The second current source 104, in addition to being connected to the conversion node C, may be connected or coupled to ground reference voltage, which may be and/or correspond to the logic low voltage of the second voltage domain GNDIO. The second current source 104, when activated, may be configured to sink current from or away from the node to generate logic low voltage.

The first and second current sources 102, 104 may be configured to operate as a push-pull circuit in that the first current source 102 may be configured to pull up the voltage at the conversion node C to a logic high level, and the second current source 104 may be configured to pull down the voltage at the conversion node C to a logic low level. Additionally, the first current source 102 and the second current source 104 may be configured to operate in tandem, such that while the first current source 102 is operating to pull up the voltage to the logic high level, the second current source 104 may be deactivated so that the voltage being generated at the conversion node C is not also being pulled down. Similarly, while the second current source 104 is operating to pull down the voltage to the logic low level, the first current source 102 may be deactivated so that the voltage being generated at the conversion node C is not also being pulled up.

The latch 106 may include a pair of cross-coupled inverters 108, 110. The inverters 108, 110 may be cross-coupled in that the input of the first inverter 108 is coupled to the output of the second inverter 110, and the output of the first inverter 108 is coupled to the input of the second inverter 110. A first end of the latch 106 that includes the input of the first inverter 108 and the output of the second inverter 110 may be connected to the conversion node C. A second end of the latch 106 that includes the output of the first inverter 108 and the input of the second inverter 110 may be connected to an inversion node Z, which may also be connected to an input of a driver circuit 112. The driver circuit 112 may function as an isolator to drive large loads. An example may be where the voltage generated at the inversion node Z is not large enough to drive a load, thus limiting speed, and so the driver circuit 112 may be configured to amplify the voltage generated at the inversion node Z to drive the load.

The second inverter 110 may be weak relative to the first inverter 108, the first current source 102, and/or the second current source 104. By configuring the second inverter 110 to be weak, the first current source 102 and the second current source 104, when activated, may be configured to pull up and pull down the voltage at the conversion node C, respectively, and when both the first current source 102 and the second current source 104 are deactivated, the latch 106 may be configured to hold and/or maintain the voltage at the conversion node C that was generated immediately prior to the first current source 102 or the second current source 104 being deactivated. For example, the first current source 102 may be activated and the second current source 104 may be deactivated to pull up the voltage at the conversion node C to the logic high voltage level. Thereafter, if the first current source 102 is deactivated so that both the first and second current sources 102, 104 are deactivated (i.e., current is neither sourced to or sinked from the conversion node C), the latch 106 may be configured to maintain the logic high voltage at the conversion node C. If the second current source 104 is then activated, the second current source 104 may overcome the weak second inverter 110 and pull down the voltage to the logic low level. Similarly, the first current source 102 may be deactivated and the second current source 104 may be activated to pull down the voltage to the logic low level at the conversion node C. Thereafter, if the second current source 104 is deactivated, the latch 106 may be configured to maintain the logic low voltage at the conversion node C. If the first current source 102 is then activated, the first current source 104 may overcome the weak second inverter 110 and pull up the voltage to the logic high level.

The second inverter 110 may be considered weak relative to the first current source 102, the second current source 104, and/or the first inverter 108 in terms of its drive current. In general, the drive current of the second inverter 110 may be weak enough so that the second inverter 110 does not inhibit the first current source 102 and/or the second current source 104 from pulling up or pulling down the voltage generated at the conversion node C. As an example, the drive current of the second inverter 110 may be on the order of about one-tenth (0.1) times the drive current of the first current source 102 and/or the second current source 104, although other drive current proportionalities may be possible. In contrast, the first inverter 108 that is configured in the forward path may not be weaker relative to the first current source 102 and/or the second current source 104 because the first inverter 108 may not be competing against the first current source 102 or the second current source 104 for setting the voltage at the conversion node C.

The latch 106 may also be configured to output a voltage at the inversion node Z that is inverted from the voltage at the conversion node C. For example, if the voltage at the conversion node C is at the logic high level, then the voltage at the inversion node Z is at the logic low level. Conversely, if the voltage at the conversion node is the logic low level, then the voltage at the inversion node Z is at the logic high level.

In addition, the level shifter 100 may include sense and control circuitry 114 that is configured activate and deactivate the first current source 102 and the second current source 104. The sense and control circuitry 114 may be separated or divided into two circuit components—first sense and control circuit portion 116 that is configured to activate and deactivate the first current source 102 and second sense and control circuit portion 118 that is configured to activate and deactivate the second current source 104.

To activate and deactivate the first and second current sources 104, 102, the sense and control circuitry 114 may be configured to sense or detect voltages of the input signals and voltages generated at the conversion node C. The sense and control circuitry 114 may further sense or detect the voltage generated at the inversion node Z to activate and deactivate the first and second current source 102, 104.

In further detail, the sense and control circuitry 114 may be configured to sense or detect logic high and low voltage levels and/or transitions between the logic high and logic low voltages of an input signal V_IN. For some example configurations, the logic high and logic low voltage levels of the input signal V_IN may be in the first voltage domain. The logic voltage levels of the voltage generated at the conversion node C may directly track and/or correspond to the logic voltage level of the single input signal V_IN. For example, when the input signal V_IN transitions to a logic high voltage, the level shifter 100 may correspondingly generate a logic high voltage at the conversion node C. Additionally, the logic voltage level generated at the inversion node Z may inversely track and/or correspond to the logic voltage level of the input signal V_IN. For example, when the input signal V_IN transitions to a logic high voltage, the level shifter 100 may set a logic low voltage on the inversion node Z.

When the sense and control circuitry 114 senses a transition of the input signal V_IN from a logic low voltage to a logic high voltage, the first sense and control circuit portion 116 may be configured to activate the first current source 102. In response, the first current source 102 may supply current to the conversion node C, which may pull up the voltage at node C to the logic high voltage $V_{DDIO}$. Additionally, in response to the transition of the input signal V_IN from the logic low voltage to the logic high voltage, the second sense and control circuit portion 118 may be configured not to activate the second current source 104, which may keep the second current source 104 deactivated and not sink current away from the conversion node C.

The sense and control circuitry 114 may further be configured to sense the voltage at the conversion node C as it is being pulled up. When the voltage reaches the logic high voltage $V_{DDIO}$ (or a triggering voltage corresponding to the logic high voltage $V_{DDIO}$), the first sense and control circuit portion 116 may be configured to deactivate the first current source 102, which may stop the supply of current to the conversion node C. Additionally, when the voltage reaches the logic high voltage $V_{DDIO}$, the second sense and control circuit portion 118 may not activate the second current source 104 and/or may keep the second current source 104 in a deactivated state.

When the voltage at the conversion node C reaches the logic high voltage $V_{DDIO}$ and the first sense and control circuit portion 116 deactivates the first current source 102, the logic high voltage $V_{DDIO}$ generated at the conversion node C may be maintained by the latch 106 even though both the first current source 102 and the second current source 104 are deactivated. The logic high voltage $V_{DDIO}$ may be maintained at the conversion node C for a time period, referred to as a static period, until the level shifter 100 operates to pull down the voltage in response to a transition shift from the logic high voltage to the logic low voltage of the input signal V_IN.

When the input signal V_IN transitions from the logic high voltage to the logic low voltage, the sense and control circuitry 114 may be configured to sense the transition, and the second sense and control circuit portion 118 may be configured to activate the second current source 104. In response, the second current source 104 may sink current away from the conversion node C, pulling down the voltage at node C to the ground reference voltage $V_{GNDIO}$ corresponding to the logic low voltage. Additionally, in response to the transition of the input signal V_IN from the logic high voltage to the logic low voltage, the first sense and control circuit portion 116 may be configured not to activate the first current source 102, which may keep the first current source 102 deactivated and not source current to the conversion node C.

The sense and control circuitry 114 may be configured to sense the voltage at the conversion node C being pulled down to the logic low voltage $V_{GNDIO}$. When the voltage reaches the logic low voltage $V_{GNDIO}$ (or a triggering voltage corresponding to the logic low voltage $V_{GNDIO}$), the second sense and control circuit portion 118 may be configured to deactivate the second current source 104, which may stop the current sink away from the conversion node C. Additionally, when the voltage reaches the logic low voltage $V_{GNDIO}$, the first sense and control circuit portion 116 may not activate the first current source 102 and/or may keep the first current source 102 in a deactivated state.

When the voltage at the conversion node C reaches the logic low voltage $V_{GNDIO}$ and the second sense and control circuit portion 118 deactivates the second current source 104, the logic low voltage $V_{GNDIO}$ generated at the conversion node C may be maintained by the latch 106 even though both the first current source 102 and the second current source 104 are deactivated. The logic low voltage $V_{GNDIO}$ may be maintained at the conversion node C for a static period of time, until the level shifter 100 operates to pull up the voltage in response to a transition shift from the logic low voltage to the logic high voltage of the input signal V_IN.

In the above described operation, the first and second current sources 102, 104 may pull up and pull down the voltage at the conversion node C, respectively, during periods of transition. However, once the logic high and low voltage levels are reached, the logic high and logic low voltage levels may be respectively maintained by the latch 106 during static periods, during which time the first and second current sources 102, 104 may be configured in deactivated states. Deactivating the first and second current sources 102, 104 during the static time periods may reduce overall power consumption of the level shifter 100 compared to if the level shifter was drawing current and consuming power during these static time periods.

Figure 2:
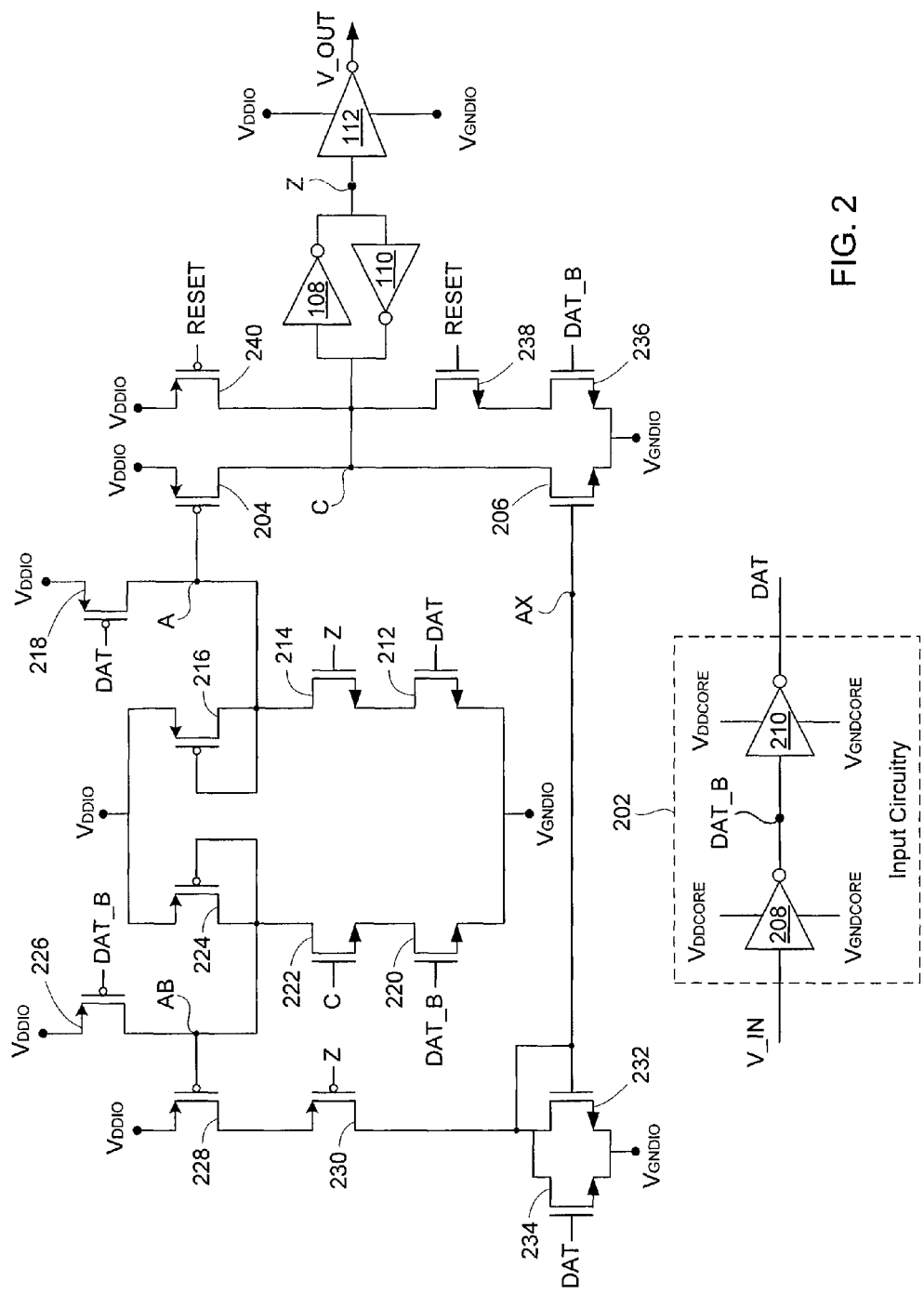
FIG. 2 is a circuit schematic diagram of an example circuit implementation of the example level shifter of FIG. 1.

FIG. 2 shows a circuit schematic diagram of an example circuit implementation 200 of the level shifter 100 of FIG. 1. The first current source 102 may include a p-type metal-oxide-semiconductor ("PMOS") transistor 204 having a source terminal connected to the logic high voltage $V_{DDIO}$ and a drain terminal connected to the conversion node C. The PMOS transistor 204 may also have a gate terminal connected to a first current source bias node A. The second current source 104 may include a n-type metal-oxide-semiconductor ("NMOS") transistor 206 having a source terminal connected to the ground reference voltage $V_{GNDIO}$ and a drain terminal connected to the conversion node C. The NMOS transistor 206 may also have a gate terminal connected to a second current source bias node AX.

The first and second sense and control circuit portions 116, 118 may control activation and deactivation of the first and second current sources 102, 104 by setting gate bias voltages on the gate terminals of the PMOS transistor 204 and the NMOS transistor 206. In particular, the first sense and control circuit portion 116 may be configured to set a bias voltage on the gate terminal of the PMOS transistor 204 at the first current source bias node A, which, depending on the level of the bias voltage, may turn the PMOS transistor MP4 "on" and "off." When the PMOS transistor 204 is turned on, the PMOS transistor 204 may source current to the conversion node C. When the PMOS transistor 204 is turned off, the PMOS transistor 204 may not source current to the conversion node C. Similarly, the second sense and control circuit portion 118 may be configured to set a bias voltage on the gate terminal of the NMOS transistor 206 at the second current source bias node AX, which, depending on the level of the bias voltage, may turn on and off the NMOS transistor 206. When the NMOS transistor 206 is turned on, the NMOS transistor 206 may sink current away from the conversion node C. When the NMOS transistor 206 is turned off, the NMOS transistor 206 may not sink current away from the conversion node C.

The first and second sense and control circuit portions 116, 118 may each include transistors that are configured to turn on and off at various points in time over a cycle of the input signal V_IN to set the gate bias voltage levels of the PMOS and NMOS transistors 204, 206 at the nodes A and AX. The transistors may be configured to turn on and off such that the PMOS and NMOS transistors 204, 206 are turned on to source current to and sink current away from the conversion node C to pull up and down the voltage generated at the conversion node C during transition periods, and are turned off to reduce and/or minimize current conduction during static periods when the voltage at the conversion node C is maintained.

In the example circuit implementation 200, the transistors making up the first sense and control circuit portion 116 may include a plurality of series-connected transistors, including a NMOS transistor 212, a NMOS transistor 214, and a PMOS transistor 216. As shown in FIG. 2, transistors 212-216 may be connected in series in that a drain terminal of the NMOS transistor 212 is connected to a source terminal of the NMOS transistor 214, and a drain terminal of the NMOS transistor 214 is connected to a drain terminal of the PMOS transistor 216. In addition, a source terminal of the PMOS transistor 216 may be connected to the logic high voltage level $V_{DDIO}$, and a source terminal of the NMOS transistor 212 may be connected to the ground reference voltage $V_{GNDIO}$. When each of the series-connected transistors 212-216 are turned on, a current may be conducted through the drain and source terminals of the series-connected transistors 212-216.

The series-connected transistors 212-216 may have a current-mirror connection with the PMOS transistor 204. In particular, gate terminals of each of the PMOS transistor 216 and the PMOS transistor 204 are connected to each other and to the drain terminal of the PMOS transistor 216 at the first current source bias node A. When current is conducted through the series-connected transistors 212-216, the current may be mirrored by the PMOS transistor 204 and sourced to the conversion node C to pull up the voltage at the conversion node C.

The first sense and control circuit portion 116 may further include a PMOS transistor 218 having a source terminal connected to the logic high voltage level $V_{DDIO}$ and a drain terminal connected to the first current source bias node A. When the PMOS transistor 218 is turned on, the voltage at the first current source bias node A may by pulled up to the logic high voltage level $V_{DDIO}$ to turn and/or keep off the PMOS transistor 204.

Similarly, the transistors making up the second sense and control circuit portion 118 may include a plurality of series-connected transistors, including a NMOS transistor 220, a NMOS transistor 222, and a PMOS transistor 224. The transistors 220-224 may be connected in series in that a drain terminal of the NMOS transistor 220 is connected to a source terminal of the NMOS transistor 222, and a drain terminal of the NMOS transistor 222 is connected to a drain terminal of the PMOS transistor 224. In addition, a source terminal of the PMOS transistor 224 may be connected to the logic high voltage level $V_{DDIO}$, and a source terminal of the NMOS transistor 220 may be connected to the ground reference voltage $V_{GNDIO}$. When each of the series-connected transistors 220-224 are turned on, a current may be conducted through the drain and source terminals of the series-connected transistors 220-224.

The series-connected transistors 220-224 may have a current-mirror connection with a PMOS transistor 228. In particular, the gate terminals of the PMOS transistor 224 and the PMOS transistor 228 are connected to each other and also to the drain terminal of the PMOS transistor 224 at a bias node AB. Additionally, the source terminals of both the PMOS transistors 224 and 228 may be connected to the logic high voltage $V_{DDIO}$. When current is conducted through the series-connected transistors 220-224, the current may be mirrored by the PMOS transistor 228.

The second sense and control circuit portion 118 may further include a PMOS transistor 226 having a source terminal connected to the logic high voltage level $V_{DDIO}$ and a drain terminal connected to the bias node AB. When the PMOS transistor 226 is turned on, the voltage at the bias node AB may by pulled up to the logic high voltage level $V_{DDIO}$ to turn and/or keep off the PMOS transistor 228.

The second sense and control circuit 118 may also include a second plurality of series-connected transistors formed by the PMOS transistor 228 along with a PMOS transistor 230 and a NMOS transistor 232. A drain terminal of the PMOS transistor 228 may be connected to a source terminal of the PMOS transistor 230, and a drain terminal of the PMOS transistor 230 may be connected to a drain terminal of the NMOS transistor 232. Additionally, a source terminal of the NMOS transistor may be connected to the ground reference voltage $V_{GNDIO}$.

The second series-connected transistors 228-232 may have a current mirror connection with the NMOS transistor 206. In particular, gate terminals of the NMOS transistor 232 and the NMOS transistor 206 may be connected to each other and also to the drain terminal of the NMOS transistor 232 at the second current source bias node AX. In this way, current conducted through the second series-connected transistors 228-232 may be mirrored by the NMOS transistor 206 to pull down the voltage at the conversion node C.

In addition, for some example circuit implementations, a NMOS transistor 234 may be connected in parallel with the NMOS transistor 232. In particular, drain terminals of the NMOS transistors 232, 234 may be connected to each other, and source terminals of the NMOS transistors 232, 234 may be connected to each other, and also to the ground reference voltage $V_{GNDIO}$. When the NMOS transistor 234 is turned on, the second current source bias node AX may be pulled down to the ground reference voltage $V_{GNDIO}$ which may turn and/ or keep off the PMOS transistor 206. As explained in further detail below, the NMOS transistor 234 may be turned on when the input signal V_IN transitions to a logic high voltage level $V_{DDCORE}$ to keep the NMOS transistor 206 off and suppress the ability of the NMOS transistor 206 to sink current away from the conversion node C when the voltage at the conversion node C is being pulled up to or maintained at the logic high voltage level $V_{DDIO}$.

The second sense and control circuit portion 118 may also include pull down circuitry to facilitate or encourage the pulling down of the voltage at the conversion node C. Because the second sense and control circuit portion 118 includes two groups of series-connected transistors and two current-mirror connections to sink current away from the conversion node C, whereas the first sense and control circuit portion 116 includes only one group of series-connected transistors and one current-mirror connection to source current to the conversion node C, the current path used to sink current away from the conversion node C may be longer than the current path used to source current to the conversion node C. As such, the time it takes the second sense and control circuit portion 118 to activate the NMOS transistor 206 to pull down the voltage at the conversion node C may be longer than the time it takes the first sense and control circuit portion 116 to activate the PMOS transistor 204 to pull up the voltage at the conversion node C. To compensate or adjust for the time lag, the example circuit implementation 200 may include pull down circuitry to facilitate pulling down the voltage at the conversion node C.

In the example circuit implementation 200, the pull down circuitry may include a NMOS transistor 236 having a source terminal connected to the source terminal of the NMOS transistor 206. In addition, a drain terminal of the NMOS transistor 236 may be coupled to the conversion node C. When the NMOS transistor 236 it turned on, the voltage at the conversion node C may be pulled down. For some example configurations, the NMOS transistor 236 may not be as strong as the NMOS transistor 206. A size of the NMOS transistor 236 may be determined to maintain a 50% duty cycle so that the voltage generated at the conversion node C experiences substantially the same delay in rise time and fall time.

As shown in FIG. 2, the NMOS transistor 236 may be coupled to the conversion node C via a first reset transistor 238. The first reset transistor 238 may be part of reset circuitry that is configured to set and/or maintain the voltage at the conversion node C at a logic high voltage level when either or both of the logic high voltage $V_{DDCORE}$ in the first voltage domain or the logic high voltage $V_{DDIO}$ in the second voltage domain is out of a predetermined operating range. If either of the logic high voltages $V_{DDCORE}$ or $V_{DDIO}$ are out of respective predetermined operating ranges, such as if their respective voltage supplies have not been activated yet or are not operating properly, the voltage generated at the conversion node C may not be pulled up or down to desired levels. For these situations, the reset circuitry may be configured to set the voltage at the conversion node C to a logic high voltage level to prevent the voltage at the conversion node C from being set to unknown or indeterminate levels.

In the example circuit implementation 200, the first reset transistor 238 may be a NMOS transistor having a source terminal connected to a drain terminal of the pull down transistor 236 and a drain terminal connected to the conversion node C. The reset circuitry may also include a second reset transistor 240, which may be a PMOS transistor having a source terminal connected to the logic high voltage level $V_{DDIO}$ and a drain terminal connected to the conversion node C.

The first and second reset transistors 238, 240 may each be configured to turn on and off in response to a reset signal RESET applied to their respective gate terminals. When one or both of the voltage $V_{DDCORE}$ and $V_{DDIO}$ are out of their respective predetermined operating ranges, the reset signal RESET applied to the gate terminals may be set to a logic low level, which may turn off the first reset transistor 238 and turn on the second reset transistor 240. Accordingly, the voltage at the conversion node C may be pulled up to the logic high voltage $V_{DDIO}$. When both the voltage $V_{DDCORE}$ and $V_{DDIO}$ are within the respective predetermined operating ranges, the reset signal RESET applied to the gate terminals may be set to a logic high level, which may turn off the second reset transistor 240 and turn on the first reset transistor 238. When the first reset transistor 238 is turned on, the pull down transistor 236, when also turned on, may sink away current to pull down the voltage at the conversion node C.

In alternative configurations, the pull down circuitry and/or the reset circuitry may not be included and/or be implemented differently. As an example, the reset circuitry may be configured to set the voltage at the conversion node C to a logic low voltage level instead of a logic high level when either or both of the voltage $V_{DDIO}$ or the voltage $V_{DDCORE}$ are out of their respective predetermined operating ranges.

The transistors making up the first and second sense and control circuit portions 116, 118 may be turned on and off at predetermined times during a cycle of the input signal V_IN to set the gate bias voltages at the nodes A, AB, and AX so that the PMOS and NMOS transistors 204, 206 are turned on to source and sink current during transition periods and are turned off to reduce and/or minimize current conduction during static periods. The on and off states of the transistors making up the first and second sense and control circuit portions 116, 118 may be determined and/or controlled by the voltage levels generated at the conversion node C and the voltage levels of the input signal V_IN. For the example circuit implementation 200, the voltage levels generated at the conversion node C and the voltage levels of the input signal V_IN, as well as their respective inverse voltage levels, may be contemporaneously used and/or applied to gate terminals of the transistors in the first and second sense and control circuit portions 116, 118 in order to determine and/or control the on and off states.

To generate an inverse of the input signal V_IN, complimentary input signals DAT and DAT_B having logic voltage levels that are inverses of each other may be generated from the input signal V_IN. The logic voltage levels of the input signal DAT may directly track and/or correspond to the logic voltage levels of the input signal YIN, whereas the logic voltage levels of the complimentary input signal DAT_B may inversely track and/or correspond to the voltage levels of the input signal V_IN. In addition, for some example configurations, the logic high and low voltage levels of the complimentary input signals DAT and DAT_B may be in the first voltage domain, which, for the example circuit implementation 200, may have a voltage $V_{DDCORE}$ corresponding to a logic high level and a ground reference voltage $V_{GNDCORE}$ corresponding to a logic low level.

To generate the complimentary signals DAT and DAT_B, the example circuit implementation 200 may include input circuitry 202 that is configured to convert the input signal V_IN into the complimentary input signals DAT and DAT_B. The input circuitry 202 may include a first inverter circuit 208 and a second inverter circuit 210. The first inverter circuit 208 and the second inverter circuit 210 may be powered by and/or connected to the voltage levels $V_{DDCORE}$, $V_{GNDCORE}$ of the first voltage domain to generate the complimentary input signals DAT and DAT_B. The first inverter circuit 208 may be configured to receive the input signal V_IN and output the complimentary input signal DAT_B. An input of the second inverter circuit 210, which may be connected to the output of the first inverter circuit 208, may receive the complimentary input signal DAT_B and output the input signal DAT.

As shown in FIG. 2, the gate terminals of the NMOS transistor 212, the PMOS transistor 218, and the NMOS transistor 234 may be connected to the output of the second inverter circuit 210 and switch on and off in accordance with the input signal DAT. In addition, the gate terminals of the NMOS transistor 220, the PMOS transistor 226, and the pull down transistor 236 may be connected to the output of the first inverter circuit 208 and switch on and off in accordance with the complimentary input signal DAT_B. Because the pull down transistor 236 switches on and off directly in response to the complimentary input signal DAT_B being applied to its gate terminal, the pull down transistor 236 may be configured to switch on and off faster than the NMOS transistor 206, which is being switched on and off due to the voltage at the second current source bias node AX. In addition, the gate terminal of the NMOS transistor 222 may be connected to the conversion node C and switch on and off in accordance with the levels of the voltage generated at the conversion node C. Also, the gate terminals of the NMOS transistor 214 and the PMOS transistor 230 may be connected to the inversion node Z and switch on and off in accordance with the levels of the voltage generated at the inversion node Z.

Figure 3:
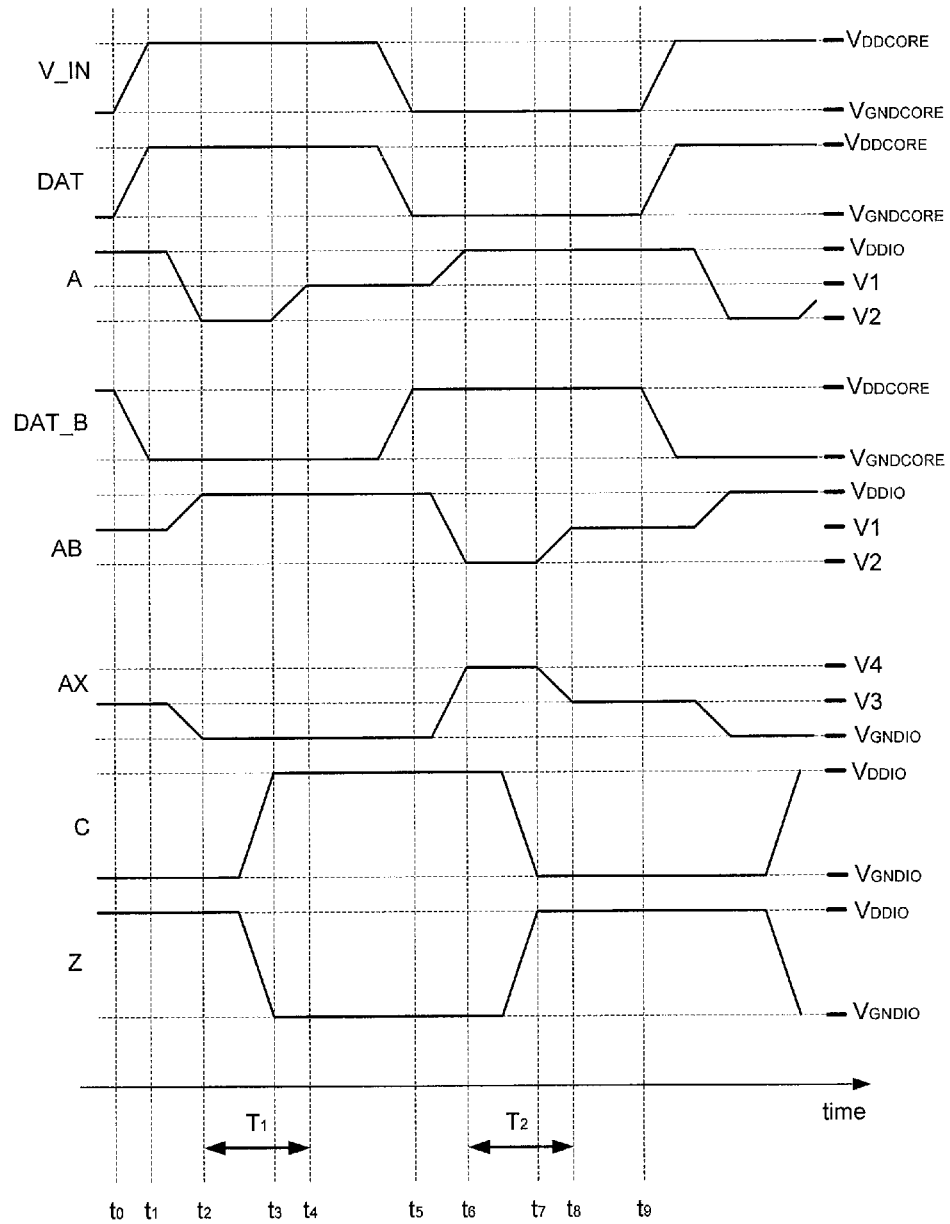
FIG. 3 is a timing diagram of voltages generated at nodes of the circuit of FIG. 2.

FIG. 3 shows a timing diagram that illustrates the relationship between the input signals V_IN, DAT, and DAT_B, the voltages generated at the bias nodes A, AX, and AB, and the logic voltage levels generated at the conversion node C and the inversion node Z over a cycle of the input signal V_IN. Operation of the example circuit implementation 200 of the level shifter 100 is described in further detail below with reference to both FIGS. 2 and 3.

A first half or portion of the cycle of the input signal V_IN may extend from an initial time $t_0$ when the input signal V_IN begins to transition from the logic low voltage level $V_{GNDCORE}$ to the logic high voltage level $V_{DDCORE}$, to a time $t_5$ when the input signal V_IN has transitioned back down from the logic high voltage level $V_{DDCORE}$ to the logic low voltage level $V_{GNDCORE}$. When the input signal V_IN transitions from the logic low voltage $V_{GNDCORE}$ to the logic high voltage $V_{DDCORE}$, the voltage generated at the conversion node C may track the transition, and correspondingly transition from the logic low voltage $V_{GNDIO}$ to the logic high voltage $V_{DDIO}$ by a time $t_3$. In order for the voltage at the conversion node C to track the transition, the transition of the input signal V_IN to the logic high voltage level $V_{DDCORE}$ in combination with the voltage level at the inversion node Z being at the logic high level $V_{DDIO}$ may cause the voltage at the first current source bias node A to drop to a voltage level V2 below $V_{DDIO}$ by the time $t_2$, which may turn on the PMOS transistor 204. This may pull up the voltage at the conversion node C and pull down the voltage at the inversion node Z by the time $t_3$. The rise of the voltage at the conversion node C and the corresponding drop of the voltage at the inversion node Z at time $t_3$ may then increase the voltage at the first current source bias node A to a voltage level V1 below $V_{DDIO}$ by a time $t_4$, which may turn off the PMOS transistor 204. In this way, over the first half or portion of the cycle from $t_0$ to $t_5$, current consumed as a result of activation of the PMOS transistor 204 may be limited to the time period T1 extending between times $t_2$ and $t_4$, during which current is sourced to pull up the voltage at the conversion node C. That is, after the time $t_4$, while the voltage level at the conversion node C is maintained, the PMOS transistor 204 is deactivated so that current consumption may be reduced or minimized. Also, over the first half or portion of the cycle, the NMOS transistor 206 may remain deactivated, which may further limit current consumption over this time period.

In further detail, at the initial time $t_0$, the input signal V_IN may begin a transition from the logic low voltage level $V_{GNDCORE}$ to the logic high voltage level $V_{DDCORE}$. The complimentary input signals DAT and DAT_B may correspondingly be at the logic low and logic high voltage levels $V_{GNDCORE}$, $V_{DDCORE}$, respectively, at the initial time $t_0$. (For simplicity purposes, any delay associated with generation of the complimentary input signals DAT and DAT_B caused by the inverter circuits 208, 210 is not shown.) In addition, at the initial time $t_0$, the voltage at the conversion node C may be at the logic low level $V_{GNDIO}$ and the voltage at the inversion node Z may be at the logic high level $V_{DDIO}$.

The logic low voltage level $V_{GNDCORE}$ of the input signal DAT may turn on the PMOS transistor 218 and turn off the NMOS transistor 212. Accordingly, at the initial time $t_0$, the voltage at the first current source bias node A may be at the logic high voltage level $V_{DDR}$), and in turn, the PMOS transistor 204 may be turned off.

In addition, at the initial time $t_0$, the logic high voltage level $V_{DDCORE}$ of the complimentary input signal DAT_B may turn on NMOS transistor 220. Also, the logic low voltage $V_{GNDIO}$ at the conversion node C may turn off the NMOS transistor 222. Further, because the logic high voltage level $V_{DDCORE}$ may not be as high as the logic high voltage level $V_{DDIO}$, when the input signal DAT_B at the logic high level $V_{DDCORE}$ is applied to the PMOS transistor 226, the PMOS transistor 226 may not turn completely off, and so some voltage drop between the drain and source terminals of the PMOS transistor 220 may result. Accordingly, at the initial time $t_0$, the voltage at the bias node AB may be at a voltage level V1 below the logic high voltage level $V_{DDIO}$.

Desirably, the difference in voltage between the voltage level V1 and the logic high voltage level $V_{DDIO}$ is small enough such that the PMOS transistors 224 and 228 are turned off and not drawing current. Accordingly, the PMOS transistor 226 may be configured relatively weak relative to the NMOS transistor 220 so that minimal current is drawn through the PMOS transistor 226 when the input signal DAT_B at the logic high level $V_{DDCORE}$ is applied to its gate terminal.

Additionally, at the initial time $t_0$, the PMOS transistor 230 is also turned off because the voltage at the inversion node Z is at the logic high level $V_{DDIO}$. Also, because the input signal DAT is at the logic low level $V_{GNDCORE}$, the NMOS transistor 234 may be turned off. Accordingly, the voltage at the second current source bias node AX may be at a voltage level V3 (i.e., the threshold voltage $V_t$ of the NMOS transistor 234) above the ground reference voltage $V_{GNDIO}$. The voltage level V3 may be small enough such that the NMOS transistor 206 may be off. As such, at the beginning of the cycle of the input signal V_IN, both the PMOS transistor 204 and the NMOS 206 may be turned off.

At the time $t_1$ when the input signal V_IN has just transitioned from the logic low voltage level $V_{GNDCORE}$ to the logic high voltage level $V_{DDCORE}$, the complimentary input signals DAT and DAT_B may correspondingly be at the logic high voltage level $V_{DDCORE}$ and the logic low voltage level $V_{GNDCORE}$, respectively. The output voltages at the conversion node C and the inversion node Z may not yet have transitioned, and so may still be at the logic low voltage $V_{GNDIO}$ and the logic high voltage $V_{DDIO}$, respectively.

The transition of the input signal V_IN from the logic low voltage $V_{GNDCORE}$ to the logic high voltage $V_{DDCORE}$ may cause the voltage at the first current source bias node A to drop to the voltage level V2 below the logic high voltage level $V_{DDIO}$ by the time $t_2$, which may turn on the PMOS transistor 204. In particular, at the time $t_1$, the input signal DAT at the logic high voltage level $V_{DDCORE}$ may turn on the NMOS transistor 212. In addition, at the time $t_1$, the NMOS transistor 214 may be on because the voltage at the inversion node Z may still be at the logic high voltage level $V_{DDIO}$. Also, like the PMOS transistor 226, when the input signal DAT at the logic high level $V_{DDCORE}$ is applied to the PMOS transistor 218, the PMOS transistor 218 may not turn completely off. Desirably, even if the PMOS transistor 218 is not turned completely off, minimal current is drawn so that the voltage at node A drops to a level that turns on the PMOS transistor 204. Accordingly, the PMOS transistor 218 may be configured relatively weak relative to the NMOS transistor 212. As such, with the NMOS transistors 212 and 214 turned on and the weak PMOS transistor 218, if not turned off, drawing relatively little current, the voltage at the first current source bias node A may drop from the logic high voltage level $V_{DDIO}$ at the time $t_1$ to the voltage level V2 by the time $t_2$.

As described, the voltage difference between the voltage level V2 and the logic high voltage level $V_{DDIO}$ may be great enough to turn on the PMOS transistors 216 and 204. Current may conduct through the branch of series-connected transistors 212-216, which may be mirrored by the PMOS transistor 204. In turn, the voltage at the conversion node C may be pulled up from the logic low voltage level $V_{GNDIO}$ to the logic high voltage level $V_{DDIO}$, and the voltage at the inversion node Z may correspondingly be pulled down to the logic low voltage level $V_{GNDIO}$ by the time $t_3$. When the voltage at the inversion node Z reaches the logic low voltage level $V_{GNDIO}$, the NMOS transistor 214 of the series-connected transistors in the first sense and control circuit portion 116 may be turned off, which may cause the voltage at the first current source bias node A to increase from the voltage level V2 to the voltage level V1 below the logic high voltage level $V_{DDIO}$ by the time $t_4$. The increase in the voltage level may turn off the PMOS transistor 204 and stop and/or minimize the flow of current being sourced to the conversion node C.

In addition, when the complimentary input signal DAT_B has finished transitioning to the logic low voltage level $V_{GNDCORE}$ at the time $t_1$, the PMOS transistor 226 may turn on, which may pull up the voltage at the bias node AB from the voltage level V1 to the logic high voltage level $V_{DDIO}$ by the time $t_2$ and maintain the PMOS transistor 228 in an off state. Additionally, at the time $t_1$, the input signal DAT at the logic high voltage level $V_{DDCORE}$ may turn on the NMOS transistor 234, which may cause the voltage at the second current source bias node AX to drop from the voltage V3 to the logic low voltage level $V_{GNDIO}$ by the time $t_2$ and maintain the NMOS transistor 206 in an off state.

A second half or portion of the cycle of the input signal V_IN may extend from the time $t_5$ when the input signal V_IN has transitioned from the logic high voltage level $V_{DDCORE}$ to the logic low voltage level $V_{GNDCORE}$, to a time $t_9$ when the input signal V_IN starts a next cycle and begins to transition from the logic low voltage level $V_{GNDCORE}$ to the logic high voltage level $V_{DDCORE}$. When the input signal V_IN transitions from the logic high voltage $V_{DDCORE}$ to the logic low voltage $V_{GNDCORE}$, the voltage generated at the conversion node C may track the transition, and correspondingly transition from the logic high voltage $V_{DDIO}$ to the logic low voltage $V_{GNDIO}$ by a time $t_7$. In order for the voltage at the conversion node C to track the transition, the transition of the input signal V_IN to the logic low voltage level $V_{GNDCORE}$ in combination with the voltage levels at the conversion node C and the inversion node Z still being at the logic high level $V_{DDIO}$ and the logic low level $V_{GNDIO}$, respectively, may cause the voltage at the second current source bias node AX to increase to a voltage level V4 by the time $t_6$, which may turn on the NMOS transistor 206. This may pull down the voltage at the conversion node C and pull up the voltage at the inversion node Z by the time $t_7$. The fall of the voltage at the conversion node C and the corresponding rise of the voltage at the inversion node Z at the time $t_7$ may then decrease the voltage at the second current source bias node AX to the level V3 by a time $t_8$, which may turn off the NMOS transistor 206. In this way, over the second half or portion of the cycle from $t_5$ to $t_9$, current consumed as a result of activation of the NMOS transistor 206 may be limited to the time period T2 extending between times $t_6$ and $t_8$, during which current is sunk to pull down the voltage at the conversion node C. That is, after the time $t_8$, while the voltage level at the conversion node C is maintained, the NMOS transistor 206 is deactivated so that current consumption may be reduced or minimized. Also, over the second half or portion of the cycle, the PMOS transistor 204 may remain deactivated, which may further limit current consumption over this time period.

In further detail, at the time $t_5$, the input signal V_IN has transitioned from the logic high voltage level $V_{DDCORE}$ to the logic low voltage level $V_{GNDCORE}$. The complimentary input signals DAT and DAT_B may correspondingly be at the logic low and logic high voltage levels $V_{GNDCORE}$, $V_{DDCORE}$, respectively, at the time $t_5$. In addition, at the time $t_5$, the voltage at the conversion node C may be at the logic high level $V_{DDIO}$ and the voltage at the inversion node Z may be at the logic low level $V_{GNDIO}$.

At the time $t_5$ when the input signal V_IN has just transitioned from the logic high voltage level $V_{DDCORE}$ to the logic low voltage level $V_{GNDCORE}$, the complimentary input signals DAT and DAT_B may correspondingly be at the logic low voltage level $V_{GNDCORE}$ and the logic high voltage level $V_{DDCORE}$, respectively. The output voltages at the conversion node C and the inversion node Z may not yet have transitioned, and so may still be at the logic high voltage $V_{DDIO}$ and the logic low voltage $V_{GNDIO}$, respectively.

The transition of the input signal V_IN from the logic high voltage $V_{DDCORE}$ to the logic low voltage $V_{GNDCORE}$ may cause the voltage at the bias node AB to drop to a voltage level V2 below the logic high voltage level $V_{DDIO}$ by the time $t_6$, which may turn on the PMOS transistor 228. In particular, at the time $t_5$, the input signal DAT_B at the logic high voltage level $V_{DDCORE}$ may turn on the NMOS transistor 220 and the weak PMOS transistor 226 may draw relatively little current, if not completely turned off. In addition, at the time $t_5$, the NMOS transistor 222 may be on because the voltage at the conversion node C may still be at the logic high voltage level $V_{DDIO}$. With the NMOS transistors 220 and 220 turned on and the PMOS transistor 226 drawing little current if not completely turned off, the voltage at the bias node AB may drop from the logic high voltage level $V_{DDIO}$ at the time $t_5$ to the voltage level V2 by the time $t_6$. The voltage difference between the voltage level V2 and the logic high voltage level $V_{DDIO}$ may be great enough to turn on the PMOS transistors 224 and 228. Current may conduct through the branch of series-connected transistors 220-224.

Additionally, at the time $t_5$, the voltage at the inversion node Z may be at the logic low voltage level $V_{GNDIO}$, which may turn on the PMOS transistor 230. Also, the input signal DAT may be at the logic low voltage level $V_{GNDCORE}$, which may turn off the NMOS transistor 234. As such, the voltage at the second current source bias node AX may rise from the logic low voltage level $V_{GNDCORE}$ to the voltage level V4 by the time $t_6$, which may turn on the NMOS transistor 206. As such, the current being conducted through the series-connected transistors 220-224 may be mirrored by the transistors 228-232, which in turn may be mirrored by the NMOS transistor 206. As a result, current may be sunk away from the conversion node C, which may drop the voltage at the conversion node C to the logic low voltage level $V_{GNDIO}$ by the time $t_7$.

For configurations of the circuit implementation 200 that include the pull down transistor 236, the pulling down of the voltage to the logic low voltage level $V_{GNDIO}$ may be facilitated or accelerated by the pull down transistor 236 because the pull down transistor 236 may by turned on in response to direct receipt of the complimentary input voltage DAT_B at the logic high voltage level $V_{DDCORE}$ at the time $t_5$.

When the voltage at the conversion node C reaches the logic low voltage level $V_{GNDIO}$ by the time $t_7$, the NMOS transistor 222 and the PMOS transistor 230 may be turned off, which may cause the voltage at the bias node AB to increase from the voltage level V2 to the voltage level V1 below the logic high voltage level $V_{DDIO}$ and cause the voltage at the second current source bias node AX to decrease from the voltage level V4 to the voltage level V3 by the time $t_8$, which may stop and/or minimize the flow of current being sunk from the conversion node C.

In addition, when the input signal DAT has finished transitioning to the logic low voltage level $V_{GNDCORE}$ at the time $t_5$, the PMOS transistor 218 may turn on, which may pull up the voltage at the first current source bias node A from the voltage level V1 to the logic high voltage level $V_{DDIO}$ by the time $t_6$ and maintain the PMOS transistor 204 in an off state.

Figure 4:
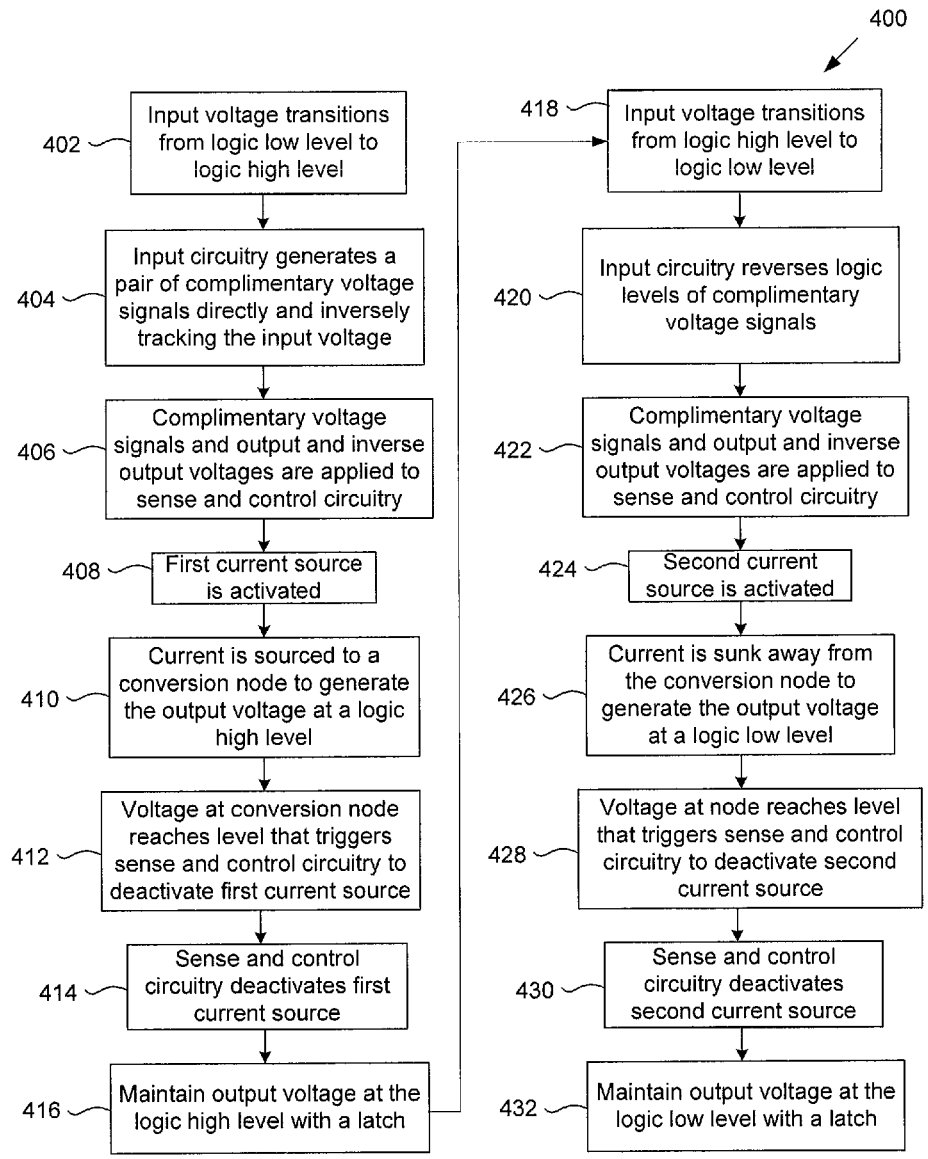
FIG. 4 is a flow chart of an example method of operating a level shifter.

FIG. 4 shows a flow chart of an example method 400 of operating a level shifter to convert an input voltage having logic high and logic low voltage levels in a first voltage domain to an output voltage having logic high and logic low voltage levels in a second voltage domain. At block 402, the input voltage being received by the level shifter may transition from the logic low level to the logic high level. At block 404, input circuitry of the level shifter may generate a pair of complimentary voltage signals, one that directly tracks the transition of the input voltage and another that inversely tracks the transition. At block 406, the pair of complimentary voltage signals may be applied to sense and control circuitry that is configured to control activation and deactivation of current source circuitry. In addition, at block 406, the output voltage and an inverse output voltage may also be applied to the sense and control circuitry.

At block 408, the sense and control circuitry may activate a first current source of the current source circuitry and deactivate (or keep deactivated) a second current source of the current source circuitry in response to receiving the pair of voltage signals tracking the transition from the logic low voltage to the logic high voltage as well as the output and inverse output voltages. Activating the first current source may include setting a bias voltage that turns on a transistor of the first current source. Deactivating (or keeping deactivated) the second current source may include setting a bias voltage that turns off (or keeps turned off) a transistor of the second current source. The sense and control circuitry may include a plurality of transistors that may be configured in on and off states to activate and deactivate the first and second current sources. The on and off states of the transistors may be controlled and/or determined by the pair of voltage signals generated by the input circuitry and the output and inverse output voltages. When the input voltage transitions from the logic low level to the logic high level, the pair of voltage signals and the output and inverse output voltages being applied to the transistors may configure the sense and control circuitry to set the bias voltages such that the first current source is activated and the second current source is deactivated.

At block 410, the first current source may source current to a conversion node to generate the output voltage at the logic high level in response to being activated. For some examples, the current that is sourced to the conversion node by the first current source may be current that is mirrored from current being conducted through a transistor of the sense and control circuitry. The transistor conducting the current may be part of a first plurality of series-connected transistors that may turn on and conduct current in response to receiving the voltage signal of the pair that tracks the input voltage and the inverted output voltage.

At block 412, the output voltage generated at the conversion node may reach the logic high level or a triggering voltage associated with the logic high level that may trigger or cause the sense and control circuitry to deactivate the first current source. At block 414, the sense and control circuitry may deactivate the first current source, which in turn may stop sourcing current to the conversion node. The sense and control circuitry may deactivate the first current source by setting a bias voltage at a level that turns off the transistor of the first current source. For some examples, the bias voltage may be set in response to the inverted output voltage reaching a level that turns off one of the transistors in the first plurality of series-connected transistors, which may stop the flow of current being conducted through the first plurality of transistors.

At block 416, the output voltage at the logic high level may be maintained at the conversion node by a latch. The latch may include a pair of cross-coupled inverters, where one of the inverters is a weak inverter relative to the other inverter, as previously described.

At block 418, the input voltage being received by the level shifter may transition from the logic high level to the logic low level. At block 420, the levels of the pair of complimentary voltage signals being generated by the input circuitry may be reversed such that the voltage signal directly tracking the input voltage has a logic low level and the voltage signal inversely tracking the input voltage has a logic high level. At block 422, the pair of complimentary voltage signals with the reversed levels may be applied to the sense and control circuitry. The output voltage having the logic high level and the inverse output voltage having the logic low level may also be applied to the sense and control circuitry.

At block 424, the sense and control circuitry may activate the second current source and deactivate (or keep deactivated) the first current source in response to receiving the pair of voltage signals tracking the transition from the logic high voltage to the logic low voltage as well as the output and inverse output voltages at the logic low and logic high levels, respectively. The first current source may be activated by setting a bias voltage that turns on the transistor of the second current source, and the second current source may be deactivated (or kept deactivated) by setting or maintaining a bias voltage that turns off (or keeps turned off) the transistor of the first current source. When the input voltage transitions from the logic high level to the logic low level, the pair of complimentary voltage signals and the output and inverse output voltages being applied to the transistors may configure the sense and control circuitry to set the bias voltages such that the second current source is activated and the first current source is deactivated.

At block 426, the second current source may sink away current from the conversion node to generate the output voltage at the logic low level in response to being activated. For some examples, the current that is sunk away from the conversion node by the second current source may be current that is mirrored from current being conducted through a transistor of the sense and control circuitry. The transistor conducting the current may be part of a second plurality of series-connected transistors that may turn on and conduct current in response to receiving the voltage signal of the pair that inversely tracks the input voltage and the output voltage. Additionally, a third plurality of series-connected transistors may mirror the current being conducted by the second plurality of series-connected transistors, which may be mirrored by the second current source to sink the current and generate the output voltage at the logic low level. The third plurality of series-connected transistors may be turned on, at least in part, by the inverted output voltage.

At block 428, the output voltage generated at the conversion node may reach the logic low level or a triggering voltage associated with the logic low level that may trigger or cause the sense and control circuitry to deactivate the second current source. At block 430, the sense and control circuitry may deactivate the second current source, which in turn may stop sinking away current from the conversion node. The sense and control circuitry may deactivate the second current source by setting a bias voltage at a level that turns off the transistor of the second current source. For some examples, the bias voltage may be set in response to the output and inverted output voltages reaching levels that turns off transistors in the second and third plurality of series-connected transistors, which may stop the flow of current being conducted through the second and third plurality of series-connected transistors.

At block 432, the output voltage at the logic low level may be maintained at the conversion node by the latch. The output voltage may be maintained at the logic low level until a next transition of the input voltage from the logic low voltage to the logic high voltage occurs, and the example method 400 may be repeated.

It is intended that the foregoing detailed description be understood as an illustration of selected forms that the embodiments can take and does not intend to limit the claims that follow. Also, some of the following claims may state that a component is operative to perform a certain function or configured for a certain task. It should be noted that these are not restrictive limitations. It should also be noted that the acts recited in the claims can be performed in any order—not necessarily in the order in which they are recited. Additionally, any aspect of any of the preferred embodiments described herein can be used alone or in combination with one another. In sum, although the present invention has been described in considerable detail with reference to certain embodiments thereof, other versions are possible. Therefore, the spirit and scope of the appended claims should not be limited to the description of the embodiments contained herein.

I claim:

1. A level shifter comprising:
   a conversion node configured to generate an output voltage having a logic high level and a logic low level;
   a first current source that, when activated, is configured to source current to the conversion node to generate the output voltage at the logic high level;
   a second current source that, when activated, is configured to sink current away from the conversion node to generate the output voltage at the logic low level;
   a latch is configured to maintain the output voltage at the conversion node when both the first current source and the second current source are deactivated; and
   sense and control circuitry configured to deactivate the second current source in response to the output voltage at the conversion node reaching a triggering level associated with the logic low level.

2. The level shifter of claim 1, wherein the latch comprises a pair of cross-coupled inverters.

3. The level shifter of claim 1, wherein a first inverter of the pair of cross-coupled inverters is a weak latch relative to a second inverter of the pair of cross-coupled inverters, and wherein an input of the second inverter and an output of the first inverter are connected to the conversion node.

4. The level shifter of claim 1, wherein the logic high level comprises a second logic high level, wherein the logic low level comprises a second logic low level, wherein the triggering level comprises a second triggering level, and wherein the sense and control circuitry is further configured to:
   activate the first current source in response to a transition of an input voltage from a first logic low level to a first logic high level;
   deactivate the first current source in response to the output voltage at the conversion node reaching a first triggering level associated with the second logic high level; and
   activate the second current source in response to a transition of the input voltage from the first logic high level to the first logic low level.

5. The level shifter of claim 4, wherein the sense and control circuitry comprises:
   a first transistor having a current-mirror connection with the first current source, wherein the first current source, to generate the output voltage at the second logic high level, is configured to mirror current conducted by the first transistor in response to the transition of the input voltage from the first logic low level to the first logic high level; and
   a second transistor having a current-mirror connection with the second current source, wherein the second current source, to generate the output voltage at the second logic low level, is configured to mirror current conducted by the second transistor in response to the transition of the input voltage from the first logic high level to the first logic low level.

6. The level shifter of claim 5, wherein the sense and control circuitry further comprises:
   a first plurality of series-connected transistors comprising the first transistor; and
   a second plurality of series-connected transistors comprising the second transistor.

7. The level shifter of claim 6, wherein the input signal comprises a first input signal, and level shifter further comprising:
   input circuitry configured to generate a second input signal and a third input signal from the first input signal, wherein the second input signal directly tracks the first logic high and low levels of the first input signal, and wherein the third input signal inversely tracks the first logic high and low levels of the first input signal,
   wherein the second input signal and an inverted output voltage are applied to the first plurality of series-connected transistors to control switching of the first plurality of series-connected transistors, and
   wherein the third input signal and the output voltage are applied to the second plurality of series-connected transistors to control switching of the second plurality of series-connected transistors.

8. The level shifter of claim 7, wherein the sense and control circuitry further comprises:
   a third plurality of series-connected transistors configured to mirror the current conducted by the second plurality of series-connected transistors,
   wherein the inverted output voltage is applied to the third plurality of series-connected transistors to control switching of the third plurality of series-connected transistors.

9. The level shifter of claim 7, wherein the latch is configured to generate the inverted output voltage.

10. The level shifter of claim 4, wherein the first current source comprises a first transistor, wherein the sense and control circuitry is configured to set a bias voltage on a biasing node to:
    a first biasing level that turns on the first transistor in response to the transition of the input voltage from the first logic low level to the first logic high level; and
    a second biasing level that turns off the first transistor in response to the output voltage reaching the first triggering level.

11. A method comprising:
   activating current source circuitry to generate, at a conversion node, an output voltage at a logic low level in response to a corresponding transition of an input voltage;
   deactivating the current source circuitry when the output voltage reaches a triggering voltage level associated with the logic low level; and
   maintaining, with a latch connected to the conversion node, the output voltage at the logic low level.

12. The method of claim 11, wherein the latch comprises a pair of cross-coupled inverters.

13. The method of claim 11, further comprising:
   generating current upon activating the current source circuitry to pull down the output voltage to the logic low level at the conversion node; and
   stopping the generation of current upon deactivating the current source circuitry.

14. The method of claim 13, further comprising:
   overcoming, with the current source circuitry, the output voltage being maintained by the latch when the current source circuitry is activated to or pull down the output voltage.

15. The method of claim 13, wherein generating current with the current source circuitry comprises mirroring, with the current source circuitry, current being generated by a transistor in response to the corresponding transition.

16. A level shifter comprising:
   current source circuitry configured to:
      pull up an output voltage at a conversion node to a second logic high level in response to a first corresponding transition of an input voltage between first logic high and first logic low levels;
      activate to pull down the output voltage at the conversion node to a second logic low level in response to a second corresponding transition of the input voltage between the first logic high and first logic low levels;
      stop pulling up the output voltage when the output voltage reaches a first triggering voltage level associated with the second logic high level; and
      stop pulling down the output voltage when the output voltage reaches a second triggering voltage level associated with the second logic low level; and
   a latch configured to maintain the output voltage at the conversion node at the second logic high and second logic low levels when the current source circuitry stops pulling up and pulling down the output voltage.

17. The level shifter of claim 16, wherein the latch comprises a pair of cross-coupled inverters.

18. The level shifter of claim 17, wherein the first inverter of the pair of cross-coupled inverters is a weak latch relative to the second inverter of the pair of cross-coupled inverters.

19. The level shifter of claim 18, wherein the current source circuitry comprises:
   a first current source configured to source current to the conversion node to pull up the output voltage to the second logic high level; and
   a second current source configured to sink away current from the conversion node to pull down the output voltage to the second logic low level.

20. The level shifter of claim 16, further comprising sense and control circuitry configured to:
   activate the current source circuitry to pull up the output voltage to the second logic high level when the input voltage transitions from the first logic low level to the first logic high level;
   activate the current source circuitry to pull down the output voltage to the second logic low level when the input voltage transitions from the first logic high level to the first logic low level;
   deactivate the current source circuitry when the output voltage reaches the first triggering level associated with the second logic high level; and
   deactivate the current source circuitry when the output voltage reaches the second triggering level associated with the second logic low level.

* * * * *